United States Patent
Kim et al.

(10) Patent No.: US 7,928,467 B2
(45) Date of Patent: Apr. 19, 2011

(54) NITRIDE SEMICONDUCTOR LIGHT EMITTING DEVICE AND MANUFACTURING METHOD OF THE SAME

(75) Inventors: Hyun Soo Kim, Gyunggi-do (KR); Joon Seop Kwak, Jeollanam-do (KR); Ki Man Kang, Jeollanam-do (KR); Jin Hyun Lee, Gyunggi-do (KR); Cheol Soo Sone, Gyunggi-do (KR); Yu Seung Kim, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 121 days.

(21) Appl. No.: 12/216,568

(22) Filed: Jul. 8, 2008

(65) Prior Publication Data

US 2009/0159920 A1 Jun. 25, 2009

(30) Foreign Application Priority Data

Dec. 21, 2007 (KR) ........................ 10-2007-0134903

(51) Int. Cl.
*H01L 33/00* (2010.01)
*H01L 33/42* (2010.01)

(52) U.S. Cl. .............. 257/103; 257/13; 257/99; 257/79; 257/98; 257/E33.023; 257/E33.064; 257/E33.072; 438/46

(58) Field of Classification Search .................. 257/99, 257/E33.023, E33.064, 13, 79, 103, 98, E33.072; 438/46
See application file for complete search history.

(56) References Cited

U.S. PATENT DOCUMENTS

| | | | |
|---|---|---|---|
| 6,316,792 B1 * | 11/2001 | Okazaki et al. | 257/99 |
| 6,693,352 B1 * | 2/2004 | Huang et al. | 257/743 |
| 6,969,873 B2 * | 11/2005 | Hata et al. | 257/94 |
| 2005/0191179 A1 * | 9/2005 | Lai et al. | 415/220 |
| 2007/0023775 A1 * | 2/2007 | Jang | 257/99 |
| 2007/0040162 A1 | 2/2007 | Song | |
| 2007/0127746 A1 * | 6/2007 | Matsuzawa | 381/191 |

FOREIGN PATENT DOCUMENTS

| | | |
|---|---|---|
| KR | 10-2002-0024490 | 3/2002 |
| KR | 10-2005-0089769 | 9/2005 |
| KR | 10-2007-0068537 A | 7/2007 |

OTHER PUBLICATIONS

Korean Office Action issued in Korean Patent Application No. KR 10-2007-0134903 dated Oct. 29, 2009.

* cited by examiner

*Primary Examiner* — Ngan Ngo
*Assistant Examiner* — Benjamin Tzu-Hung Liu
(74) *Attorney, Agent, or Firm* — McDermott Will & Emery LLP

(57) ABSTRACT

There is provided a nitride semiconductor light emitting device including: a light emitting structure including n-type and p-type nitride semiconductor layers and an active layer disposed therebetween; n- and p-electrodes electrically connected to the n-type and p-type nitride semiconductor layers, respectively; and an n-type ohmic contact layer disposed between the n-type nitride semiconductor layer and the n-electrode and including a first layer and a second layer, the first layer formed of an In-containing material, and the second layer disposed on the first layer and formed of a transparent conductive oxide. The nitride semiconductor light emitting device including the n-electrode exhibits high light transmittance and superior electrical characteristics. Further, the nitride semiconductor light emitting device can be manufactured by an optimal method to ensure superb optical and electrical characteristics.

11 Claims, 6 Drawing Sheets

NITRIDE SEMICONDUCTOR LIGHT EMITTING DEVICE AND MANUFACTURING METHOD OF THE SAME

CROSS-REFERENCE TO RELATED APPLICATIONS

This application claims the priority of Korean Patent Application No. 2007-0134903 filed on Dec. 21, 2007, in the Korean Intellectual Property Office, the disclosure of which is incorporated herein by reference.

BACKGROUND OF THE INVENTION

1. Field of the Invention

The present invention relates to a nitride light emitting device and a manufacturing method of the same, and more particularly, to a nitride light emitting device including an n-electrode, which exhibits high light transmittance and superb electrical characteristics, and a manufacturing method of the same.

2. Description of the Related Art

A light emitting diode (LED), as one type of a semiconductor light emitting device, generates light of various colors since electrons and holes are recombined at a junction of p-type and n-type semiconductors when a current is supplied. This LED is greatly advantageous over a filament-based light emitting device. That is, the LED has longer useful life, lower voltage, superior initial driving characteristics, high vibration resistance and high tolerance to repetitive power connection/disconnection. This has continually boosted demand for the LED. Notably, of late, a group III nitride semiconductor capable of emitting light at a short wavelength such as blue light has been highlighted.

FIG. 1 is a cross-sectional view illustrating a conventional nitride semiconductor light emitting device.

The nitride semiconductor device 10 includes a conductive substrate 14, and an ohmic contact layer 17, a p-type nitride semiconductor layer 13, an active layer 12 and an n-type nitride semiconductor layer 11 sequentially formed on the conductive substrate 14. Also, the nitride semiconductor device 10 includes an n-electrode 16 formed on a top of the n-type nitride semiconductor layer 11.

The nitride semiconductor light emitting device 10 of FIG. 1 is a vertical light emitting device, and accordingly has electrons and holes recombined in the active layer 12 to emit light outward mainly through the n-type nitride semiconductor layer 11.

Here, the holes are injected uniformly to some extent due to the conductive substrate 14 serving as a p-electrode. However, the n-electrode 16 is locally positioned on the top of the n-type nitride semiconductor layer 11, thus preventing the injected electrons from being diffused uniformly through the n-type nitride semiconductor layer 11. Therefore, current is crowded below the n-electrode 16. Here, light generated from the active layer 12 is considerably absorbed by the n-electrode 16. This undermines light emitting characteristics, and decreases an effective area for current flow to thereby degrade electrical characteristics.

Therefore, there has been a demand in the art for a method of manufacturing the LED in which current is distributed uniformly and light generated can be extracted easily.

SUMMARY OF THE INVENTION

An aspect of the present invention provides a nitride semiconductor device including an n-electrode, which exhibits high light transmittance and superior electrical characteristics, and a manufacturing method of the same.

According to an aspect of the present invention, there is provided a nitride semiconductor light emitting device including: a light emitting structure including n-type and p-type nitride semiconductor layers and an active layer disposed therebetween; n- and p-electrodes electrically connected to the n-type and p-type nitride semiconductor layers, respectively; and an n-type ohmic contact layer disposed between the n-type nitride semiconductor layer and the n-electrode and including a first layer and a second layer, the first layer formed of an In-containing material, and the second layer disposed on the first layer and formed of a transparent conductive oxide.

The first layer may be formed of an In alloy.

The In alloy may include at least one element selected from a group consisting of Ti, Al, Cr, Ni, Pd, Pt, Mo, Co and Mg.

The second layer may include at least one material selected from a group consisting of In, Sn, Al, Zn and Ga.

The second layer may include at least one material selected from a group consisting of ITO, CIO, AZO, ZnO, NiO and $In_2O_3$.

The first layer may have a thickness ranging from 10 to 300 Å.

The second layer may have a thickness ranging from 500 to 5000 Å.

A surface of the n-type nitride semiconductor layer where the n-type ohmic contact layer is formed may be one of a Ga-polar surface and an N-polar surface.

According to another aspect of the present invention, there is provided a method of manufacturing a nitride light emitting device, the method including: depositing an n-type nitride semiconductor layer, an active layer and a p-type nitride semiconductor layer sequentially to form a light emitting structure; forming an n-type ohmic contact layer by forming a first layer made of an In-containing material on one surface of the n-type nitride semiconductor layer and a second layer made of a transparent conductive oxide on the first layer; forming an n-electrode on the n-type ohmic contact layer; and forming a p-electrode to electrically connect to the p-type nitride semiconductor layer.

The method may further include heat-treating the n-type ohmic contact layer, after the forming an n-type ohmic contact layer.

The heat-treating the n-type ohmic contact layer may be performed at a temperature of 300 to 500° C.

The first layer may be formed by sputtering.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
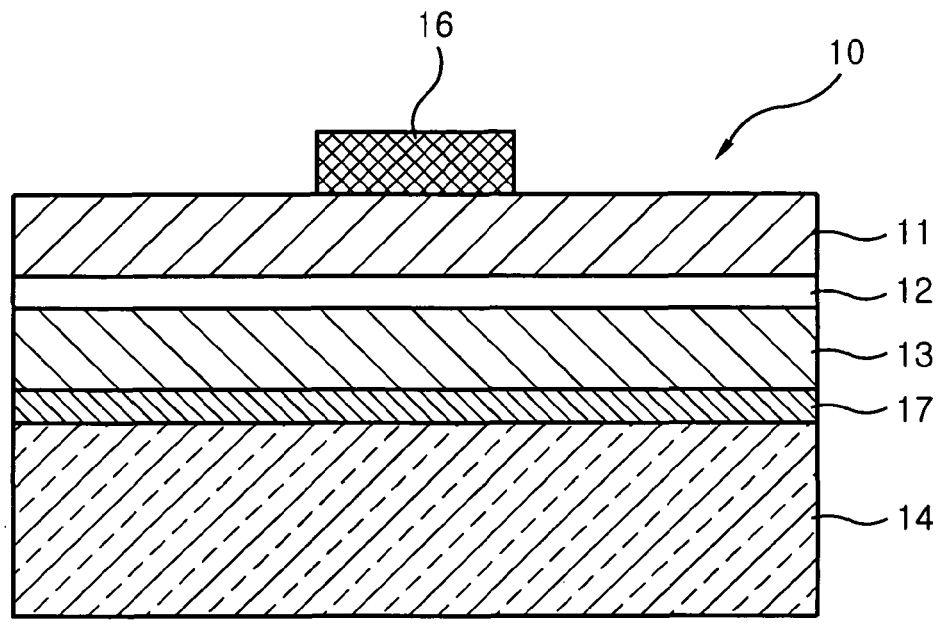
FIG. 1 is a cross-sectional view illustrating a conventional semiconductor light emitting device.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
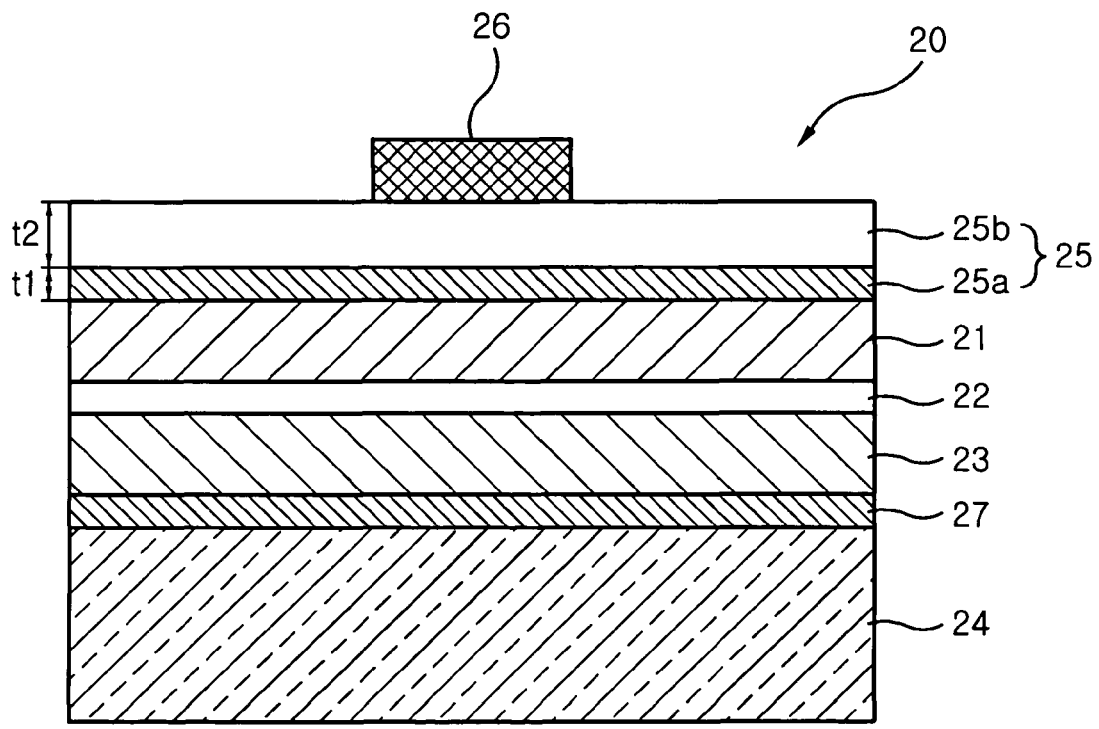
FIG. 2 is a cross-sectional view illustrating a nitride semiconductor light emitting device according to an exemplary embodiment of the invention.

FIG. 2 is a cross-sectional view illustrating a nitride semiconductor light emitting device according to an exemplary embodiment of the invention.

Referring to FIG. 2, the semiconductor light emitting device 20 of the present embodiment includes a conductive substrate 24, and a high reflectivity ohmic contact layer 27, a p-type nitride semiconductor layer 23, an active layer 22, an n-type nitride semiconductor layer 21 and an n-type ohmic contact layer 25 sequentially formed on the conductive substrate 24. In addition, an n-electrode 26 is formed on a top of the n-type ohmic contact layer 25.

In the present embodiment, the semiconductor light emitting device 20 is formed of a vertical nitride semiconductor light emitting device. As a known method for manufacturing this semiconductor light emitting device 20, the n-type nitride semiconductor layer 21, the active layer 22 and the p-type nitride semiconductor layer 23 are sequentially grown on a nitride single crystal growth substrate such as a sapphire substrate. Then, a conductive substrate 24 is formed as a support substrate by plating or bonding, and the sapphire substrate is removed.

Hereinafter, components of the semiconductor light emitting device 20 will be described in greater detail.

First, the n-type and p-type nitride semiconductor layers 21 and 23 and an active layer 22 constituting a light emitting structure will be described. In this specification, a "nitride semiconductor" denotes a binary, ternary or quaternary compound semiconductor having a composition expressed by $Al_xIn_yGa_{(1-x-y)}N$, where $0 \leq x \leq 1$, $0 \leq y \leq 1$, and $0 \leq x+y \leq 1$.

That is, the n-type and p-type nitride semiconductor layers 21 and 23 may be formed of a semiconductor material doped with n-and p-dopant and having a composition expressed by $Al_xIn_yGa_{(1-x-y)}N$, where $0 \leq x \leq 1$, $0 \leq y \leq 1$, and $0 \leq x+y \leq 1$. Representative examples of such a semiconductor material include GaN, AlGaN, and InGaN. Also, the n-type dopant employs Si, Ge, Se, Te or C and the p-type dopant utilizes Mg, Zn or Be.

The active layer 22 is formed of an undoped nitride semiconductor layer having a single or multiple quantum well structure, and emits light with a predetermined energy by recombination of electrons and holes.

The n-type and p-type nitride semiconductor layers 21 and 23, and the active layer 22 may be grown by a growth process of a semiconductor singe crystal, particularly metalorganic chemical vapor deposition (MOCVD), molecular beam epitaxy (MBE) and hydride vapor phase epitaxy (HVPE), which are notably known as processes for growing a nitride single crystal.

The high reflectivity ohmic contact layer 27, even though not required essentially, may have a reflectivity of at least 70% and forms an ohmic contact with the p-type nitride semiconductor layer 23. This high reflectivity ohmic contact layer 27 may be formed of at least one layer made of a material selected from a group consisting of Ag, Ni, Al, Rh, Pd, Ir, Ru, Mg, Zn, Pt, Au and a combination thereof. The high reflectivity ohmic contact layer 27 may be formed of at least one of Ni/Ag, Zn/Ag, Ni/Al, Zn/Al, Pd/Ag, Pd/Al, Ir/Ag. Ir/Au, Pt/Ag, Pt/Al and Ni/Ag/Pt.

The conductive substrate 24 supports the light emitting structure of a relatively small thickness when the single crystal growth substrate is removed. Also, the conductive substrate 24 may be bonded to a printed circuit board (PCB) by a conductive bonding layer to act as a p-electrode.

The conductive substrate 24 may be joined to the light emitting structure by plating or wafer bonding, and is formed of a material such as Si, Cu, Ni, Au, W, and Ti.

The n-electrode 26 serves as an electrode for electrically connecting the device. Here, the n-electrode 26 is typically made of an alloy containing Au or Au. This n-electrode 26 may be formed by deposition or sputtering, which is a general process for growing a metal layer.

The n-type ohmic contact layer 25 forms an electrical ohmic contact between the n-type nitride semiconductor layer 21 and the n-electrode 26. This ensures injected electrons to be diffused with higher efficiency and current to be distributed uniformly, thereby reducing light absorption in the n-electrode 26 and increasing emission efficiency of the light emitting device.

To this end, the n-type ohmic contact layer 25 is structured to include two layers, i.e., first layer 25a and second layer 25b formed on the first layer 25a. Specifically, the first layer 25a is made of a material containing Indium (In), and the second layer 25b is made of a transparent conductive oxide.

The first layer 25a can be formed of any material containing In. Particularly, the first layer 25a may be formed of only In or an alloy thereof.

In has a relatively low work function of about 4.12 eV and is suitable as an n-type ohmic contact metal. Particularly, the In layer, when deposited below the transparent conductive oxide layer, exhibits high light transmittance and superior electrical properties. In this case, the In layer may be formed on the n-type nitride semiconductor layer 21, particularly, by sputtering in place of e-beam deposition. This is because In has a low melting point of about 157° C. and growth thereof cannot be controlled by general e-beam deposition.

Meanwhile, in a case where the first layer 25a is an In alloy, the alloy may contain elements such as Ti, Al, Cr, Ni, Pd, Pt, Mo, Co, and Mg, and the elements will be adequately selected in view of electrical resistance and light transmittance.

The second layer 25b may utilize any material having high transmittance and relatively low electrical conductivity. The most appropriate material is a transparent conductive oxide (TCO).

The second layer 25b, when formed of the transparent conductive oxide, can ensure high light transmittance, notably, in the vertical nitride semiconductor light emitting device.

Here, the transparent conductive oxide of the second layer 25b is a material containing elements such as In, Sn, Al, Zn, and Ga. For example, the transparent conductive oxide includes ITO, CIO, ZnO, NiO, or $In_2O_3$.

Meanwhile, the first layer 25a and the second layer 25b of the n-type ohmic contact layer 25 have respective thicknesses t1 and t2 properly adjusted to control electrical resistance and light transmittance.

Here, to form an ohmic contact, the first layer 25a has a thickness t1 ranging from 10 to 300 Å. Also, the second layer 25b has a thickness t2 ranging from 500 to 5000 Å to ensure electrical conductivity. These are results obtained by conducting tests on various conditions such as a heat-treatment temperature, and will be described later with reference to FIGS. 4 to 11.

Figure 3:
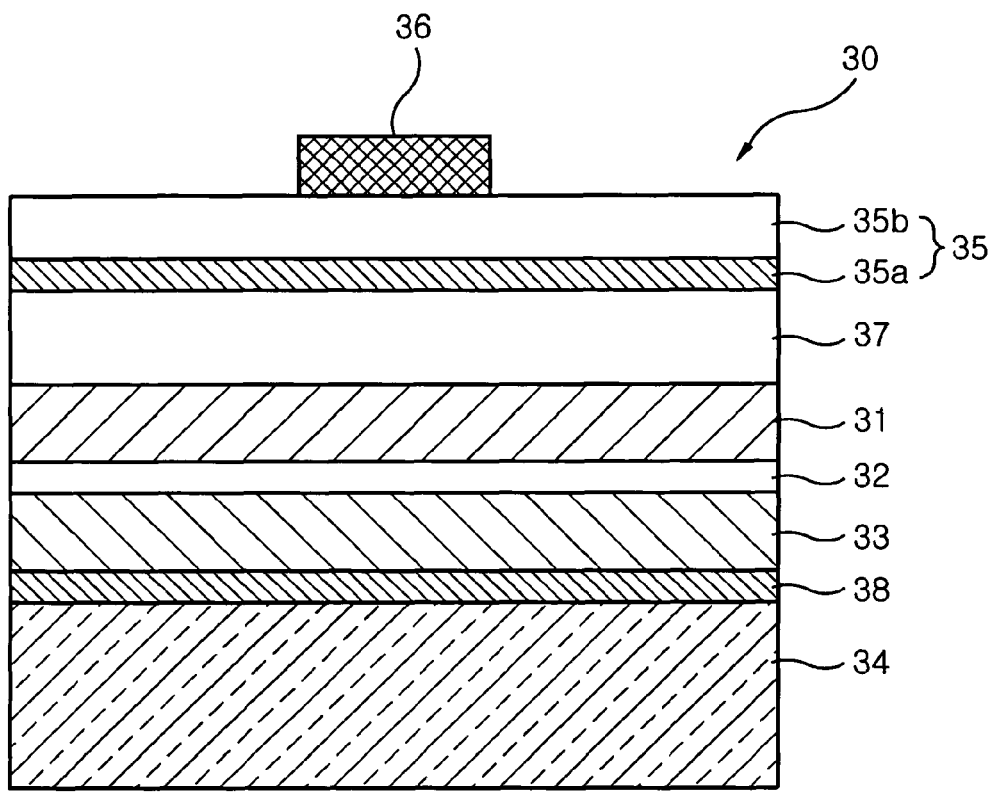
FIG. 3 is a cross-sectional view illustrating a nitride semiconductor light emitting device according to a modified embodiment of FIG. 2.

FIG. 3 is a cross-sectional view illustrating a nitride semiconductor light emitting device according to a modified embodiment of FIG. 2.

In the same manner as FIG. 2, the nitride semiconductor light emitting device 30 of FIG. 3 includes a conductive substrate 34, and a high reflectivity ohmic contact layer 38, a p-type nitride semiconductor layer 33, an active layer 32, an n-type nitride semiconductor layer 31 and an n-type ohmic contact layer 35 having first and second layers 35a and 35b. Also, an n-electrode 36 is formed on a top of the n-type ohmic contact layer 35.

Moreover, a GaN substrate 37 is formed between the n-type nitride semiconductor layer 31 and the n-type ohmic contact layer 35.

The GaN substrate 37 serves as a substrate for growing a nitride single crystal. The GaN substrate 37 is electrically conductive and thus can remain in a final light emitting device 30 without being removed after the light emitting structure is grown. However, the GaN substrate 37 may be substituted by other substrate made of an electrically conductive material for growing the nitride single crystal. For example, a SiC substrate may be utilized as long as it is easily employed by those skilled in the art.

Besides the above difference, other components of FIG. 3 termed identically are construed to be the same as those of FIG. 2, and thus will not be described in further detail.

FIGS. 4 to 11 are graphs illustrating test examples for deriving an optimal structure and process conditions of the n-type ohmic contact layer applied to the present invention.

Figure 4:
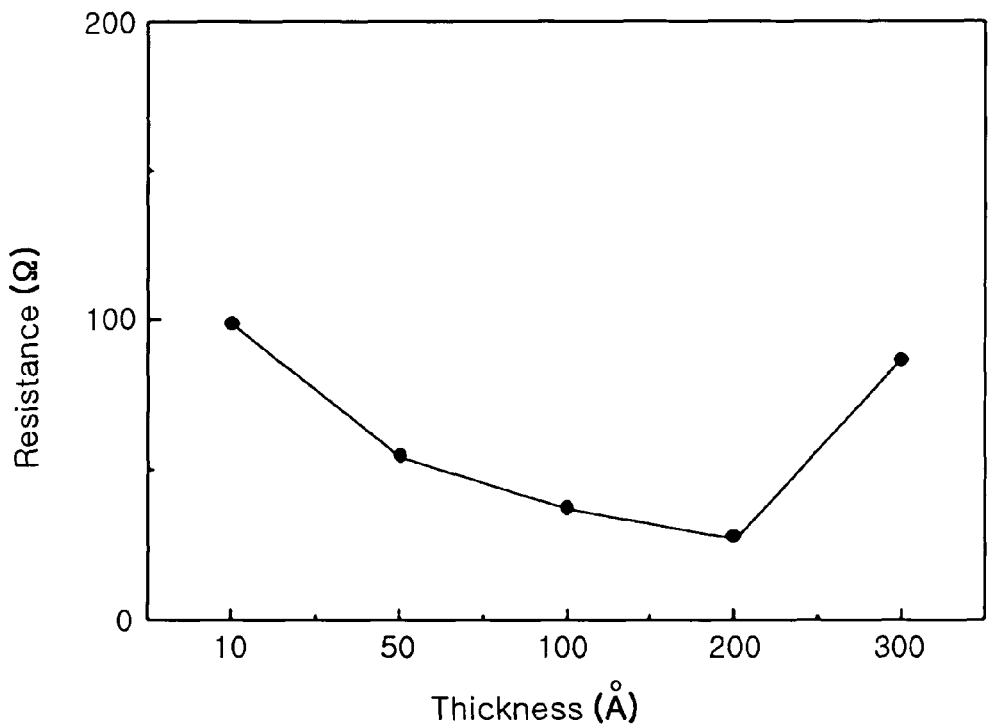
FIG. 4 is a graph illustrating a change in resistance with respect to a thickness of an In layer (first layer) in an n-type ohmic contact layer according to an exemplary embodiment of the invention, and obtained from an I-V curve measured at CTLM spacing of 28 μm.

First, FIG. 4 is a graph illustrating a change in resistance with respect to a thickness of an In layer (first layer) in an n-type ohmic contact layer according to an exemplary embodiment of the invention, and obtained from an I-V curve measured at CTLM spacing of 28 μm. Here, the resistance is equal to a total sum covering contact resistance between the n-type nitride semiconductor layer and the In layer, and resistance of the n-type nitride semiconductor layer.

Also, for test conditions, the second layer is formed of ITO having a thickness of 200 nm. The n-type ohmic contact layer is heat-treated at a temperature of 400° C.

Referring to the graph of FIG. 4, with increase in thickness of the In layer, resistance is decreased but begins to ascend from a thickness of about 200 Å. This is because too small a thickness of the In layer does not assure easy formation of ohmic contact, thereby increasing resistance.

Therefore, through this test, the first layer, i.e., In layer of the n-type ohmic contact layer has an adequate thickness ranging from 100 to 200 Å. However, the In layer having a thickness outside the above range does not have too big resistance to be used as an ohmic contact layer. Thus, the In layer applicable to the present invention may have a thickness ranging from 10 to 300 Å.

Figure 5:
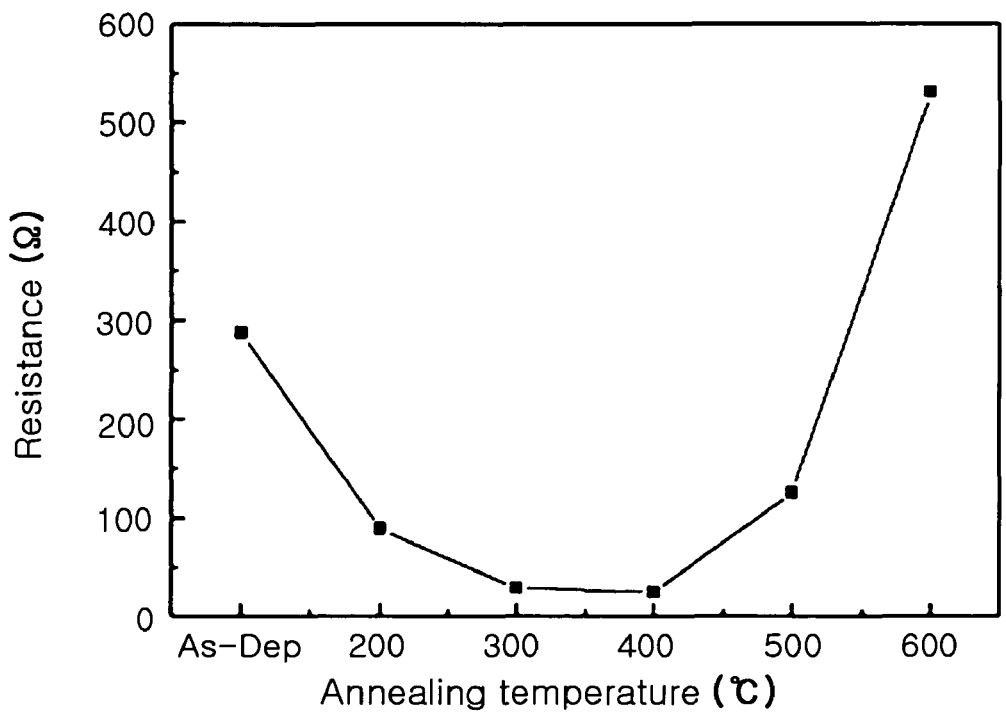
FIG. 5 is a graph illustrating a change in resistance with respect to a heat-treatment temperature of an n-type ohmic contact layer.
Figure 6:
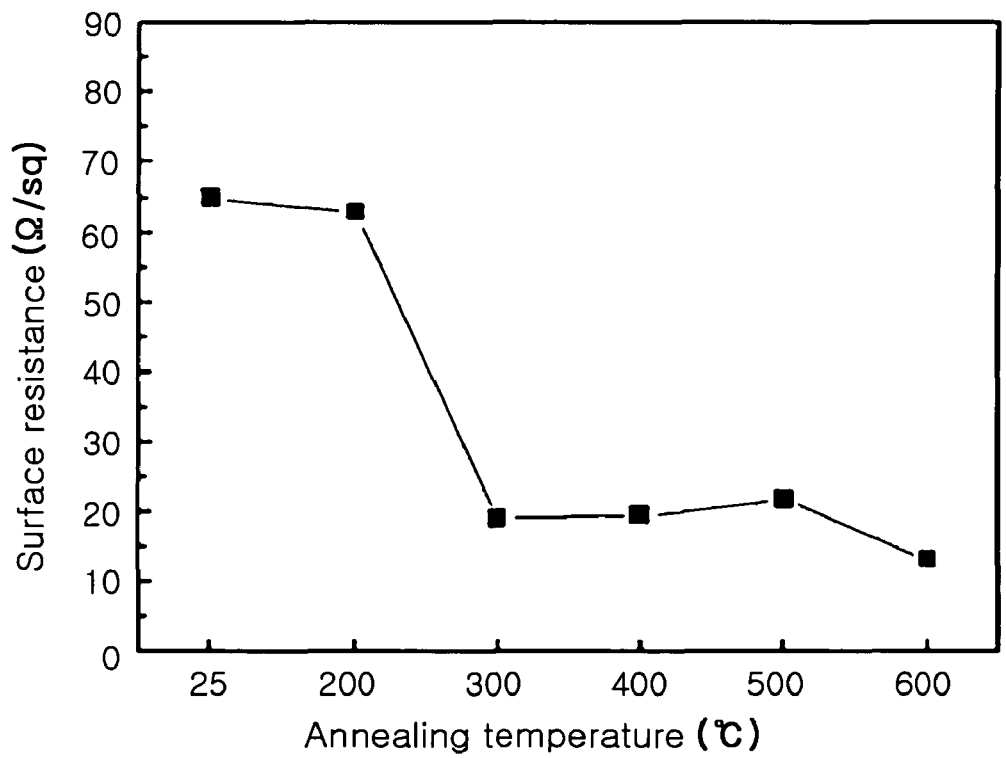
FIG. 6 is a graph illustrating a change in surface resistance with respect to a heat-treatment temperature of an n-type ohmic contact layer.

FIG. 5 is a graph illustrating a change in resistance with respect to a heat-treatment temperature of an n-type ohmic contact layer. FIG. 6 is a graph illustrating a change in surface resistance with respect to a heat-treatment temperature of an n-type ohmic contact layer. For test conditions, the In layer as the first layer has a thickness of 20 nm and the ITO layer as the second layer has a thickness of 200 nm.

Referring to the graph of FIG. 5, resistance is minimized when the n-type ohmic contact layer is heat-treated at a temperature of 300 to 500° C. Meanwhile, referring to the graph of FIG. 6, the n-type ohmic contact layer may be heat-treated at a temperature of at least 300° C. to reduce surface resistance.

In consequence, the n-type ohmic contact layer may be heat-treated, particularly, at a temperature of 300 to 500° C.

Meanwhile, the n-type ohmic contact layer is understood to be heat-treated by a known method such as rapid thermal annealing (RTA).

Figure 7:
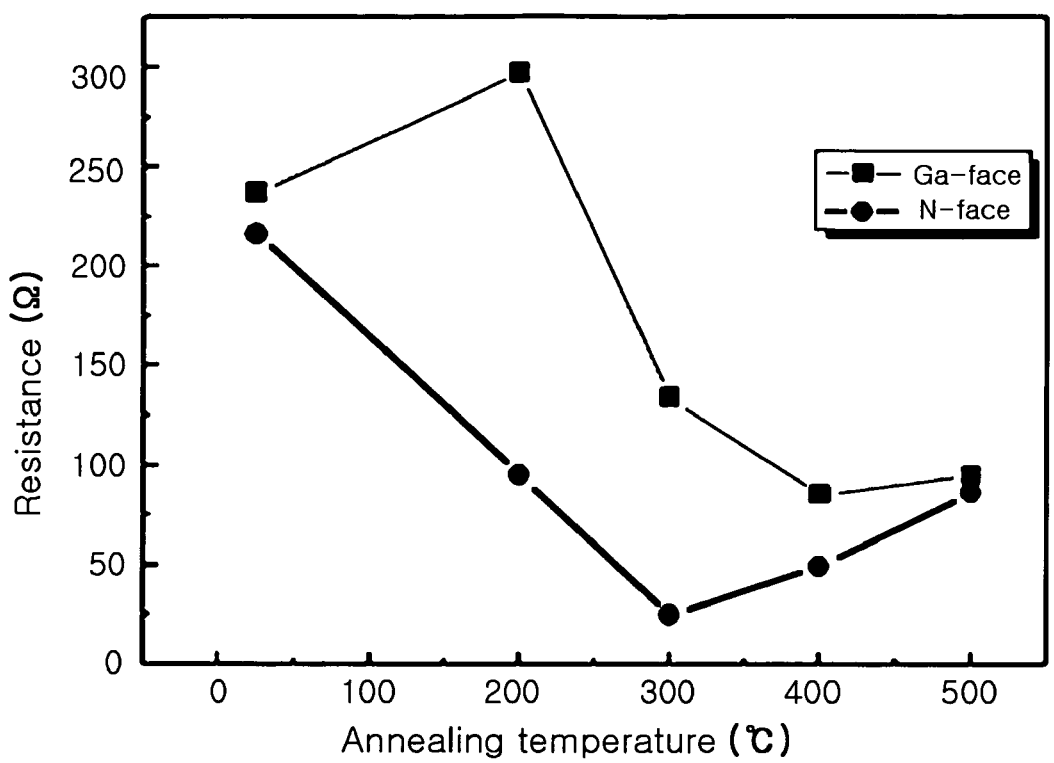
FIG. 7 is a graph illustrating a change in resistance with respect to a heat-treatment temperature of an n-type ohmic contact layer, in both cases where a surface of the n-type nitride semiconductor layer where an n-type ohmic contact layer is formed is a Ga-polar surface and is an N-polar surface.

FIG. 7 is a graph illustrating a change in resistance with respect to a heat-treatment temperature of an n-type ohmic contact layer, in both cases where a surface of the n-type nitride semiconductor layer where an n-type ohmic contact layer is formed is a Ga-polar surface and is an N-polar surface. Here, the In layer has a thickness of 20 nm, the ITO layer has a thickness of 200 nm, and the result is obtained from an I-V curve measured at CTLM spacing of 120 μm.

FIGS. 4 to 6 demonstrate results when the surface of the n-type nitride semiconductor layer where the n-type ohmic contact layer is formed is a Ga-polar surface. In general, when the light emitting device has electrodes arranged in a planar structure, the n-type ohmic contact layer is formed on the Ga-polar surface of the n-type nitride semiconductor layer.

Referring to FIG. 7, the n-type ohmic contact layer exhibits lower resistance when formed on the N-polar surface than on the Ga-polar surface at substantially all heat-treatment temperatures subject to tests.

As described above, the n-type ohmic contact layer of an In/ITO structure ensures better electrical characteristics in a planar light emitting device and a vertical light emitting device as well. Particularly, the n-type ohmic contact layer is more beneficially applicable to the vertical light emitting device since light can be emitted through the n-type ohmic contact layer.

FIGS. 8 to 11 are graphs plotted when the transparent conductive oxide layer adopts AZO (Al-doped ZnO).

Figure 8:
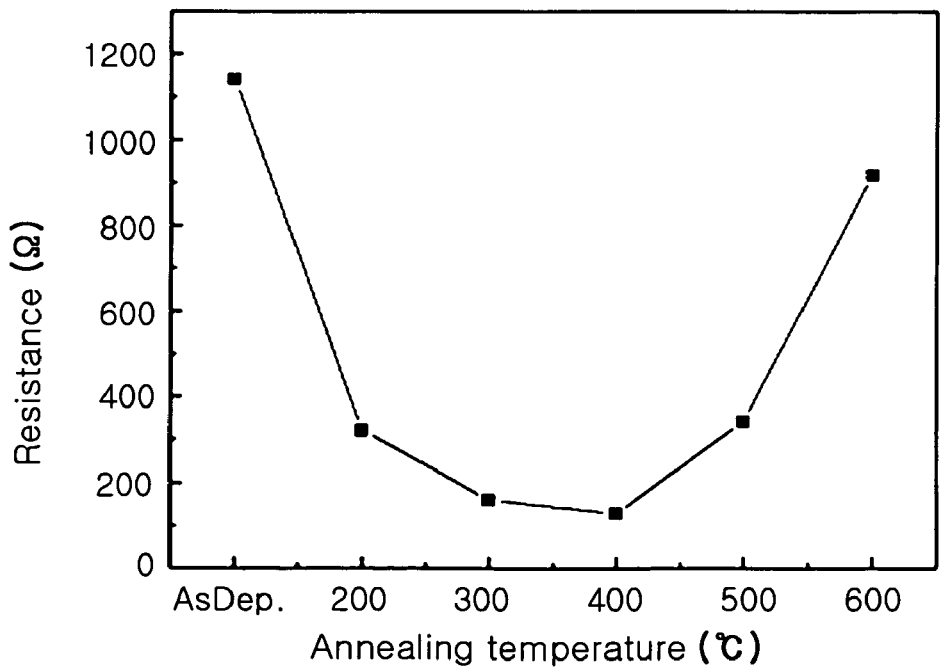
FIG. 8 is a graph illustrating a change in resistance with respect to a heat treatment temperature of an n-type ohmic contact layer, when AZO is used for a transparent conductive oxide layer (second layer)
Figure 9:
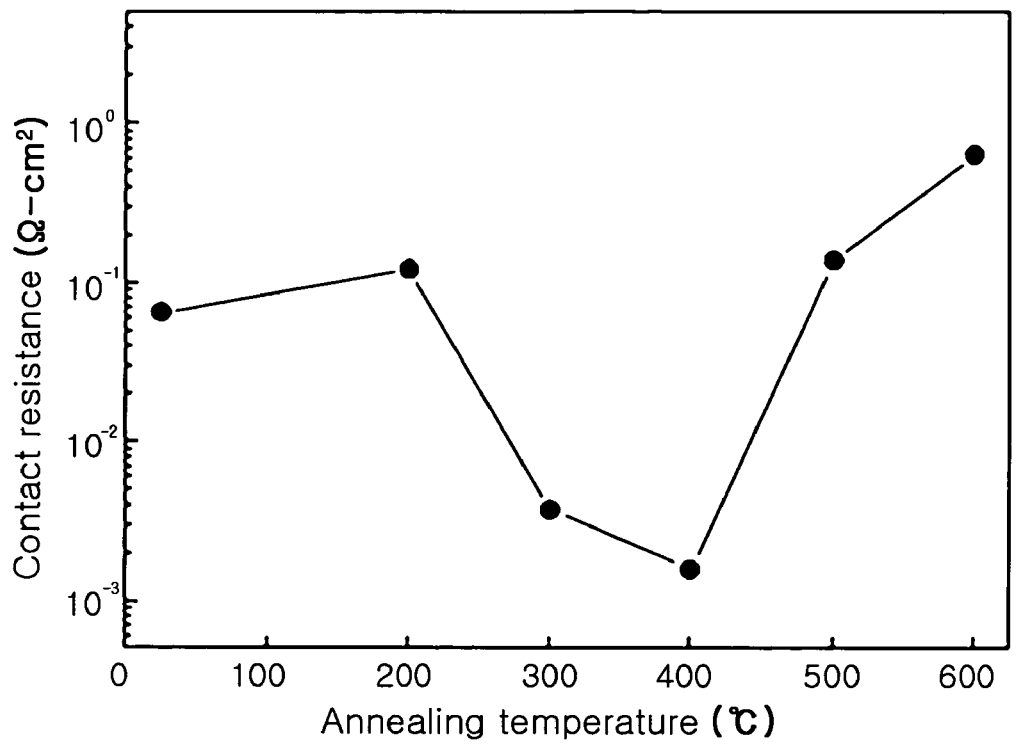
FIG. 9 is a graph illustrating a change in contact resistance with respect to a heat treatment temperature of an n-type ohmic contact layer, when AZO is used for a transparent conductive oxide layer (second layer)
Figure 10:
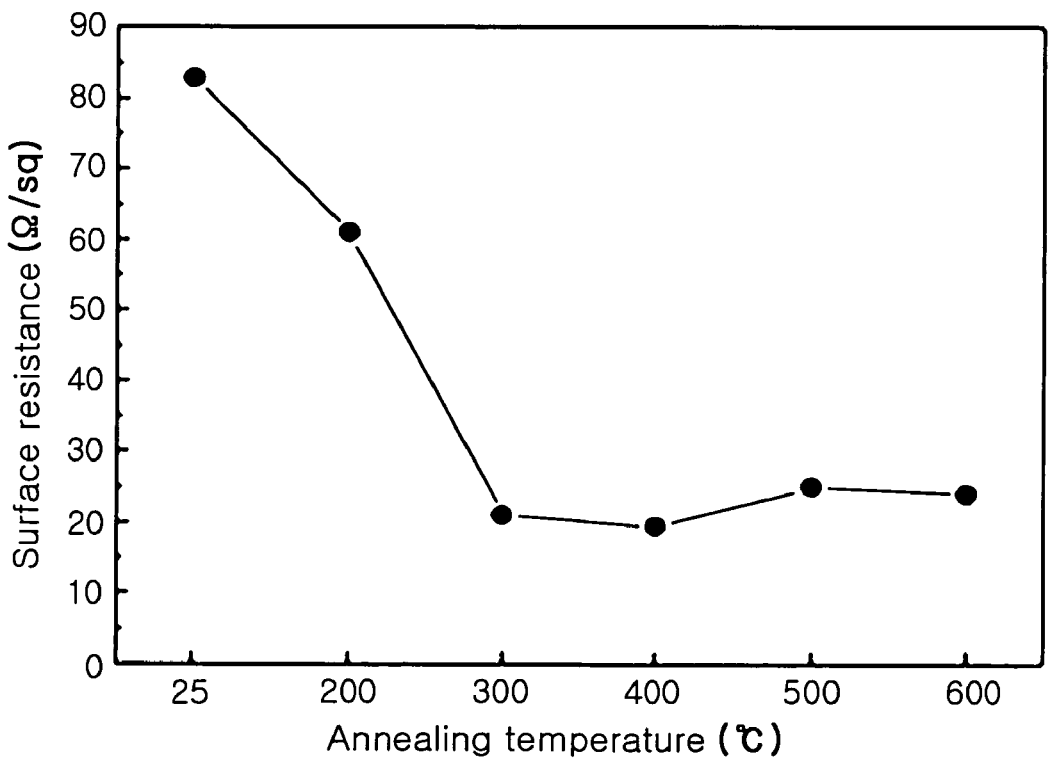
FIG. 10 is a graph illustrating a change in surface resistance with respect to a heat treatment temperature of an n-type ohmic contact layer, when AZO is used for a transparent conductive oxide layer (second layer)

First, FIGS. 8 to 10 are graphs illustrating a change in resistance, contact resistance and a surface resistance with respect to a heat treatment (annealing) temperature of an n-type ohmic contact layer, respectively when AZO is used for a transparent conductive oxide layer (second layer). Here, the contact resistance denotes resistance between the In layer and the n-type nitride semiconductor layer. For test conditions, in the same manner as the previous embodiments, the In layer as the first layer has a thickness of 20 nm, the AZO layer as the second layer has a thickness of 200 nm, and other conditions are identical to those of FIGS. 5 and 6.

Referring to the graphs of FIGS. 8 to 10, similar characteristics are plotted when the AZO is utilized as the second layer in a similar manner to when the ITO is adopted as the second layer. That is, when the heat-treatment temperature is 400° C., the contact resistance is approximately $1.6 \times 10^{-3}$ $\Omega \cdot cm^2$. When the n-type ohmic contact layer is heat-treated at a temperature of 300 to 500° C., the lowest electrical resistance is plotted.

Figure 11:
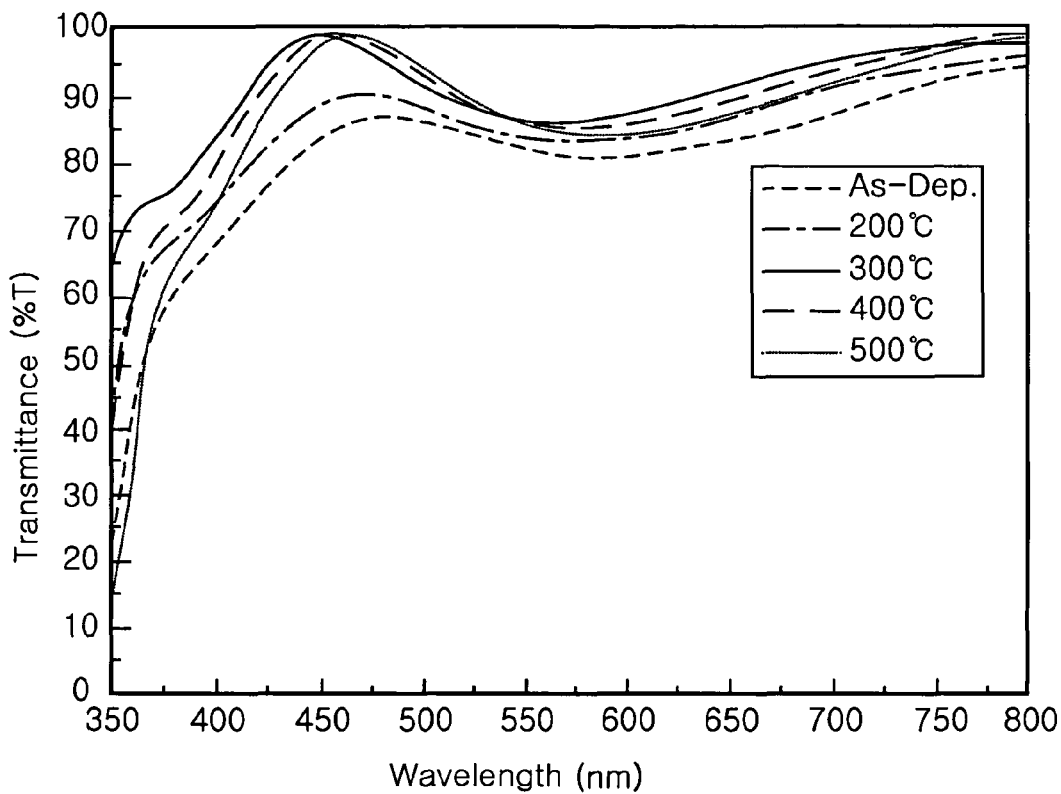
FIG. 11 is a graph illustrating a change in light transmittance with respect to an emission wavelength in an n-type ohmic contact layer of an In/AZO structure by varying a heat-treatment temperature according to an exemplary embodiment of the invention.

FIG. 11 is a graph illustrating a change in light transmittance with respect to emission wavelength in an n-type ohmic contact layer of an In/AZO structure according to an exemplary embodiment of the invention.

As shown in FIG. 11, heat-treatment, when performed, leads to greater light transmittance than prior to the heat-treatment, i.e., As-Dep. state. Light transmissivity is most superior when the n-type ohmic contact layer is heat-treated at a temperature of 300° C. to 500° C.

Meanwhile, the n-type ohmic contact layer, i.e., In layer having a thickness of 20 nm and ITO layer having a thickness of 200 nm as shown in FIG. 4 exhibits primary function, i.e., linear characteristics based on analysis of an I-V curve measured at CTLM spacing of 28 μm. That is, the n-type ohmic contact layer of the present embodiment has high light transmittance and forms an ohmic contact with the n-type nitride semiconductor layer.

Figure 12:
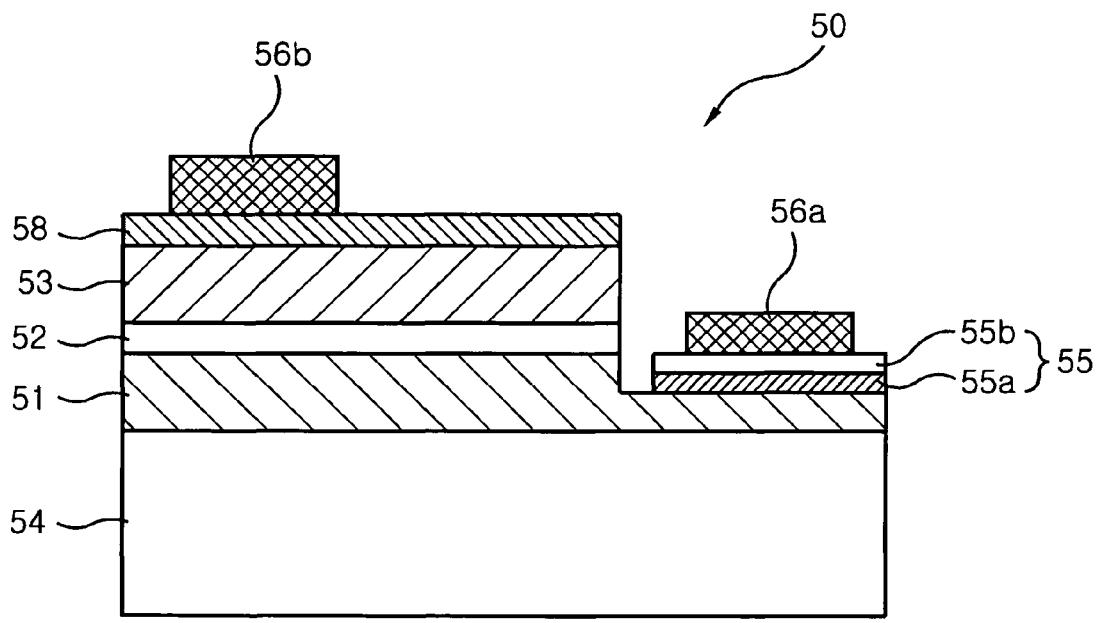
FIG. 12 is a cross-sectional view illustrating a light emitting device according to another exemplary embodiment of the invention.

FIG. 12 is a cross-sectional view illustrating a light emitting device according to another exemplary embodiment of the invention.

The nitride semiconductor light emitting device 50 includes a sapphire substrate 54, and an n-type nitride semiconductor layer 51, an active layer 52, a p-type nitride semiconductor layer 53, and a p-type ohmic contact layer 58 formed sequentially on the sapphire substrate 54. Also, the n-type nitride semiconductor 51 is partially etched and an n-type ohmic contact layer 55 is formed on a portion of the partially etched n-type nitride semiconductor 51. The nitride semiconductor light emitting device 50 also includes n-type and p-type electrodes 56a and 56b.

In the present embodiment, the n-type and p-type electrodes 56a and 56b are arranged in a planar configuration. Compared with the vertical light emitting device, the n-type ohmic contact layer 55 may ensure somewhat lower light transmittance. However, the electrodes of the light emitting device according to the present embodiments may be arranged not only in a vertical but also planar configuration.

The n-type ohmic contact layer 55 is applicable not only to the vertical but also planar light emitting device as described above. This demonstrates that in any case where the n-type ohmic contact layer is formed on the N-polar surface or the P-polar surface of the n-type nitride semiconductor layer, the n-type ohmic contact layer forms an ohmic contact with the n-type nitride semiconductor layer.

Meanwhile, the p-type ohmic contact layer 58 is not an essential constituent but may generally utilize an Ni/Au structure to form an ohmic contact with the p-type nitride semiconductor layer 53.

Besides this difference, other constituents termed identically are considered as identical to those of FIG. 2 and thus will not be described in further detail.

As set forth above, a nitride semiconductor light emitting device according to exemplary embodiments of the invention includes an n-electrode with high light transmittance and superior electrical properties.

In addition, the nitride semiconductor light emitting device with superior optical and electrical characteristics can be manufactured by an optimal method.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
    a conductive substrate;
    a p-type nitride semiconductor layer formed on the conductive substrate;
    an active layer formed on the p-type nitride semiconductor layer;
    an n-type nitride semiconductor layer formed on the active layer;
    n-electrode electrically connected to the n-type and p-type nitride semiconductor layers; and
    an n-type ohmic contact layer disposed between the n-type nitride semiconductor layer and the n-electrode and comprising a first layer and a second layer, the first layer formed of an In-containing material, and the second layer disposed between the first layer and the n-electrode and formed of a transparent conductive oxide,
    wherein a surface of the n-type nitride semiconductor layer where the n-type ohmic contact layer is formed is an N-polar surface.

2. The nitride semiconductor light emitting device of claim 1, wherein the first layer is formed of an In alloy.

3. The nitride semiconductor light emitting device of claim 2, wherein the In alloy comprises at least one element selected from a group consisting of Ti, Al, Cr, Ni, Pd, Pt, Mo, Co and Mg.

4. The nitride semiconductor light emitting device of claim 1, wherein the second layer comprises at least one material selected from a group consisting of In, Sn, Al, Zn and Ga.

5. The nitride semiconductor light emitting device of claim 1, wherein the second layer comprises at least one material selected from a group consisting of ITO, CIO, AZO, ZnO, NiO and $In_2O_3$.

6. The nitride semiconductor light emitting device of claim 1, wherein the first layer has a thickness ranging from 10 to 300Å.

7. The nitride semiconductor light emitting device of claim 1, wherein the second layer has a thickness ranging from 500 to 5000 Å.

8. A method of manufacturing a nitride light emitting device, the method comprising:
    depositing an n-type nitride semiconductor layer, an active layer and a p-type nitride semiconductor layer sequentially to form a light emitting structure on a single crystal growth substrate;

forming a conductive substrate on the p-type nitride semiconductor layer;

removing the single crystal growth substrate from the light emitting structure;

forming an n-type ohmic contact layer by forming a first layer made of an In-containing material on the exposed surface of the n-type nitride semiconductor layer and a second layer made of a transparent conductive oxide on the first layer; and forming an n-electrode on the second layer of the n-type ohmic contact layer;

wherein a surface of the n-type nitride semiconductor layer where the n-type ohmic contact layer is formed is an N-polar surface.

9. The method of claim 8, further comprising heat-treating the n-type ohmic contact layer, after the forming an n-type ohmic contact layer.

10. The method of claim 9, wherein the heat-treating the n-type ohmic contact layer is performed at a temperature of 300 to 500° C.

11. The method of claim 8, wherein the first layer is formed by sputtering.

* * * * *